United States Patent
Gill et al.

(10) Patent No.: US 9,513,349 B2
(45) Date of Patent: Dec. 6, 2016

(54) SCISSOR TYPE MAGNETIC SENSOR WITH HIGH MAGNETIC MOMENT BIAS STRUCTURE FOR REDUCED SIGNAL ASYMMETRY

(71) Applicant: HGST Netherlands B.V., Amsterdam (NL)

(72) Inventors: Hardayal S. Gill, Palo Alto, CA (US); Kuok S. Ho, Emerald Hills, CA (US); Suping Song, Fremont, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/174,776

(22) Filed: Feb. 6, 2014

(65) Prior Publication Data
US 2015/0221325 A1    Aug. 6, 2015

(51) Int. Cl.
*G11B 5/39* (2006.01)
*G01R 33/09* (2006.01)

(52) U.S. Cl.
CPC ............ *G01R 33/098* (2013.01); *G11B 5/398* (2013.01); *G11B 5/3912* (2013.01); *G11B 5/3932* (2013.01); *G11B 2005/3996* (2013.01)

(58) Field of Classification Search
USPC .................................................... 360/324.12
See application file for complete search history.

(56) References Cited

U.S. PATENT DOCUMENTS

| | | | |
|---|---|---|---|
| 5,576,914 A | 11/1996 | Rottmayer et al. | |
| 5,818,685 A * | 10/1998 | Thayamballi et al. | 360/324 |
| 6,778,357 B2 * | 8/2004 | Tabakovic | B82Y 10/00 360/125.5 |
| 6,781,798 B2 * | 8/2004 | Gill | B82Y 10/00 360/314 |
| 6,833,976 B2 * | 12/2004 | Hsu | G11B 5/3116 360/119.07 |
| 6,980,406 B2 * | 12/2005 | Gill | 360/324.12 |
| 7,271,986 B2 | 9/2007 | Sapozhnikov et al. | |
| 7,397,638 B2 * | 7/2008 | Gill | 360/324.12 |
| 7,639,456 B2 * | 12/2009 | Hong et al. | 360/324.1 |
| 7,705,586 B2 * | 4/2010 | van Zon | G01L 5/223 324/207.21 |
| 7,804,668 B2 * | 9/2010 | Zhou | B82Y 10/00 360/324.12 |
| 8,018,691 B2 * | 9/2011 | Gill et al. | 360/324.12 |
| 8,144,437 B2 * | 3/2012 | Miyauchi et al. | 360/324.12 |
| 8,147,994 B2 * | 4/2012 | Matsuzawa et al. | 428/812 |
| 8,179,642 B2 * | 5/2012 | Kawamori | B82Y 10/00 360/319 |
| 8,233,247 B2 | 7/2012 | Carey et al. | |
| 8,390,963 B2 * | 3/2013 | Dimitrov et al. | 360/319 |

(Continued)

OTHER PUBLICATIONS

Zhu J.G., "New Heights for Hard Disk Drives," Materials Today, Jul./Aug. 2003, pp. 22-31.

*Primary Examiner* — Brian Miller
(74) *Attorney, Agent, or Firm* — Zilka-Kotab, PC (57) ABSTRACT

A scissor type magnetic sensor having a magnetic bias structure extending from the back edge of first and second magnetic free layers. The magnetic bias structure is constructed of a magnetic material having a high magnetic moment, such as NiFe with a high Fe content or CoFe. The high magnetic moment bias structure reduces magnetic signal asymmetry while also maintaining high signal amplitude.

16 Claims, 8 Drawing Sheets

(56) References Cited

U.S. PATENT DOCUMENTS

| | | | |
|---|---|---|---|
| 8,724,265 B2* | 5/2014 | Qiu et al. | 360/324.12 |
| 8,749,926 B1* | 6/2014 | Le et al. | 360/324.12 |
| 8,889,019 B1* | 11/2014 | Mao et al. | 216/22 |
| 8,891,208 B2* | 11/2014 | Degawa et al. | 360/319 |
| 8,907,666 B2* | 12/2014 | Le et al. | 324/244 |
| 8,932,667 B2* | 1/2015 | Qiu et al. | 427/127 |
| 8,976,492 B1* | 3/2015 | Kataoka et al. | 360/319 |
| 9,001,472 B2* | 4/2015 | Singleton et al. | 360/319 |
| 9,007,725 B1* | 4/2015 | Diao et al. | 360/236.5 |
| 9,076,468 B1* | 7/2015 | Keener et al. | 360/313 |
| 9,153,258 B2* | 10/2015 | Le | G11B 5/3906 |
| 9,280,992 B1* | 3/2016 | Jiang | G11B 5/39 |
| 9,384,763 B1* | 7/2016 | Liu | G11B 5/3932 |
| 2001/0008712 A1* | 7/2001 | Yazawa | B82Y 10/00 428/826 |
| 2009/0135529 A1* | 5/2009 | Shimazawa et al. | 360/319 |
| 2009/0257154 A1* | 10/2009 | Carey et al. | 360/324.12 |
| 2010/0097729 A1* | 4/2010 | Gill et al. | 360/324 |
| 2011/0007426 A1 | 1/2011 | Qiu et al. | |
| 2011/0026169 A1* | 2/2011 | Gill et al. | 360/324.12 |
| 2011/0228428 A1* | 9/2011 | Dimitrov et al. | 360/320 |
| 2011/0317313 A1* | 12/2011 | Miyauchi et al. | 360/245.3 |
| 2012/0229935 A1 | 9/2012 | Song et al. | |
| 2014/0022668 A1* | 1/2014 | Takagishi et al. | 360/97.11 |

\* cited by examiner

SCISSOR TYPE MAGNETIC SENSOR WITH HIGH MAGNETIC MOMENT BIAS STRUCTURE FOR REDUCED SIGNAL ASYMMETRY

FIELD OF THE INVENTION

The present invention relates to magnetic data recording and more particularly to a magnetic sensor having a back edge magnetic bias structure formed of a high magnetic moment material.

BACKGROUND

At the heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When current flows through the coil, a resulting magnetic field causes a magnetic flux to flow through the coil, which results in a magnetic write field emitting from the tip of the write pole. This magnetic field is sufficiently strong that it locally magnetizes a portion of the adjacent magnetic media, thereby recording a bit of data. The write field then, travels through a magnetically soft under-layer of the magnetic medium to return to the return pole of the write head.

A magnetoresistive sensor such as a Giant Magnetoresistive (GMR) sensor or a Tunnel Junction Magnetoresistive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the magnetic media.

The ever present need for increased data density requires the reduction of various sensor dimensions which can present challenges to sensor design, performance and magnetization. One parameter that can be reduced to improve data density is the gap spacing of the magnetic sensor, as this correlates to magnetic bit length and magnetic bit spacing. Reduction of this gap length in a traditional giant magnetoresistive sensor or tunnel junction sensor is limited by the need for various magnetic layers necessary for the performance of such a sensor. For example, pinning of the pinned layer structure requires the use of a relatively thick layer of anti-ferromagnetic material (AFM layer) and also requires a complex pinning layer structure such as an AP coupled structure that includes first and second magnetic layers that are anti-parallel coupled across a non-magnetic anti-parallel coupling layer, with one of the magnetic layers being exchange coupled with the AFM layer. The presence of these necessary layers increases gap spacing and reduction of the thickness of these layers is problematic. The thickness of these layers can only reduced so much without affecting sensor performance, reliability and robustness.

One type of sensor that shows promise in reducing gap spacing is a scissor sensor design. Such a sensor includes two magnetic free layers that have magnetizations that are biased in directions that are orthogonal to one another. In such a sensor, a pinned layer structure is not necessary so the complex, thick pinning structure can be eliminated. However, such sensor present challenges with regard to design and sensor performance, such as biasing of the two magnetic free layers. Therefore, there remains a need for a scissor sensor design that can provide a sensor that is practical to manufacture, while providing superior magnetic performance and reliability.

SUMMARY

Provided herein is a magnetic sensor having first and second magnetic free layers that are anti-parallel coupled with one another by a non-magnetic anti-parallel coupling layer located there-between. The magnetic bias layers have a back edge located opposite from a media facing surface. The sensor also includes a magnetic bias layer that extends from the back edge of the first and second magnetic free layers and that is formed of a magnetic material having a high magnetic moment.

The high magnetic moment magnetic bias layer advantageously reduces signal asymmetry while also maintaining high signal amplitude. While it has been believed that a high magnetic moment material could not be used because such materials have a low magnetic coercivity and do not, therefore, maintain their magnetization as a result of their inherent high magnetic moment, it has been found, surprisingly, that high magnetic moment materials can be used as a bias structure in such a sensor if certain design considerations are taken into account and that performance advantages can be achieved through the use of such materials.

The magnetic bias structure can be constructed of a material such as NiFe having a high Fe content, or from a CoFe alloy.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
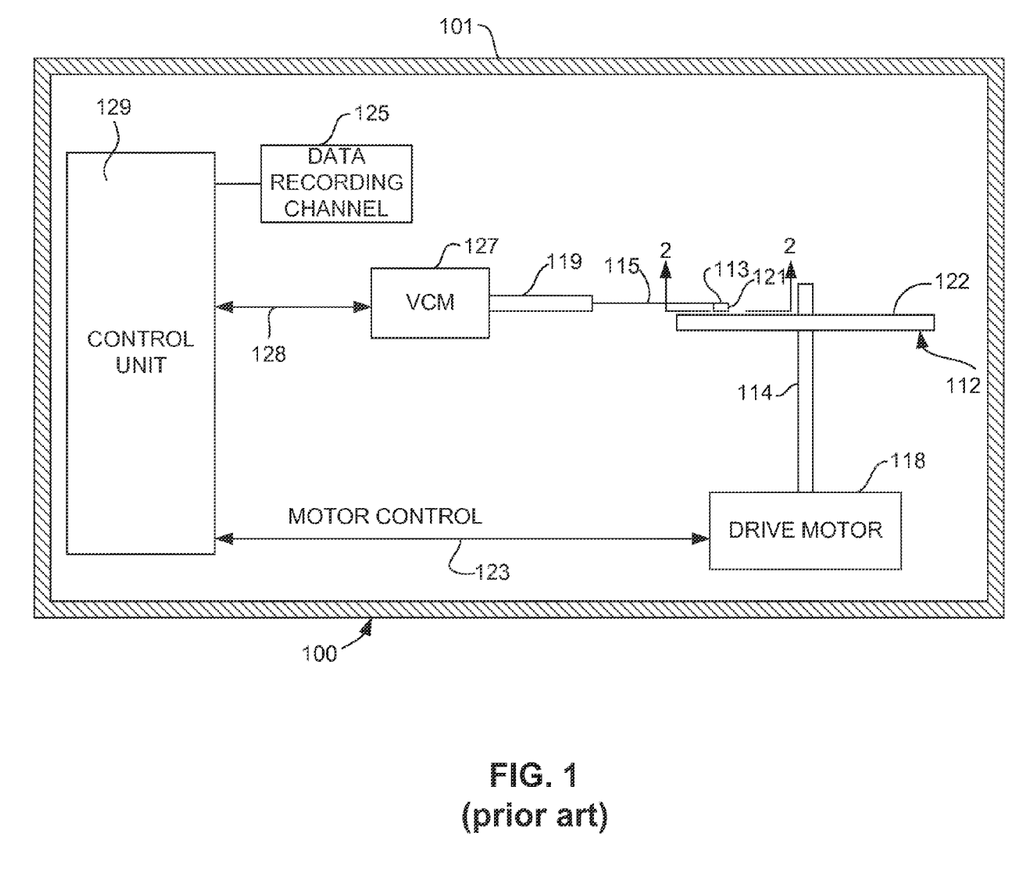
FIG. 1 is a schematic illustration of a disk drive system in which the invention might be embodied.

Referring now to FIG. 1, there is shown a disk drive 100. The disk drive 100 includes a housing 101. At least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by the controller 129.

During operation of the disk storage system, the rotation of the magnetic disk 112 generates an air bearing between the slider 113 and the disk surface 122, which exerts an upward force or lift on the slider. The air bearing thus counter-balances the slight spring force of the suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage, means and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the media 112. Write and read signals are communicated to and from write and read heads 121 by way of recording channel 125.

Figure 2:
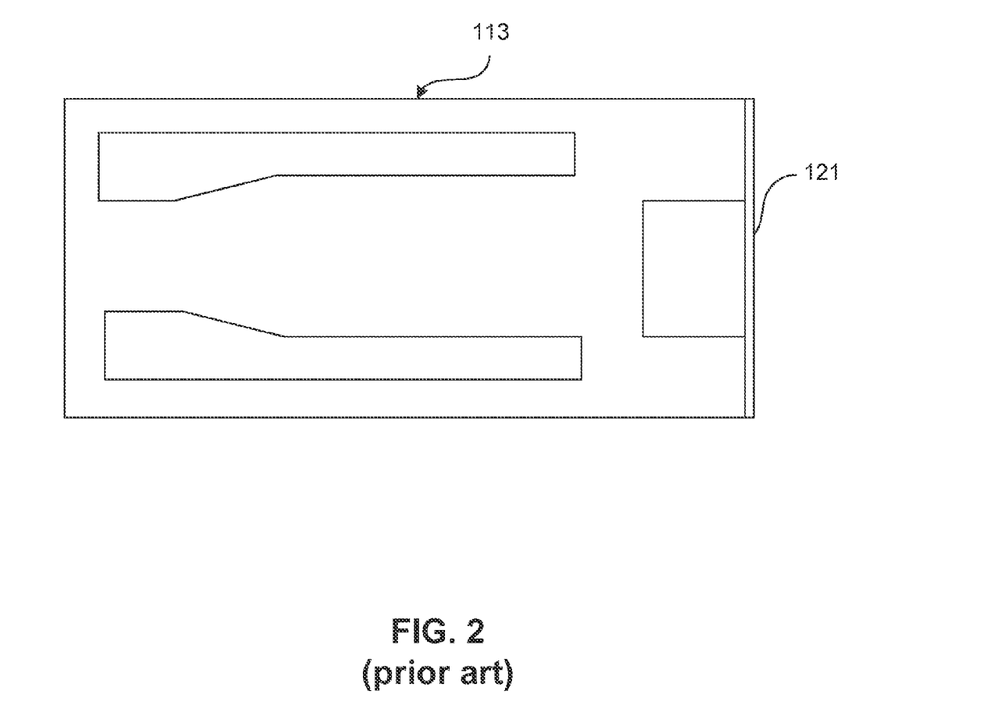
FIG. 2 is view of a slider illustrating the location of a magnetic head thereon, as seen from the medium facing surface.

With reference to FIG. 2, the orientation of the magnetic head 121 in a slider 113 can be seen in more detail. FIG. 2 is a media facing surface (MFS) view of the slider 113, and as can be seen, the magnetic 121 head, including an inductive write head and a read sensor, is located at a trailing edge of the slider. The above description of a typical magnetic disk storage system and the accompanying illustration of FIGS. 1 and 2 are for representation purposes only. It should be apparent that the disk storage system may contain a large number of disks and actuators, and each actuator may support a number of sliders.

Figure 3:
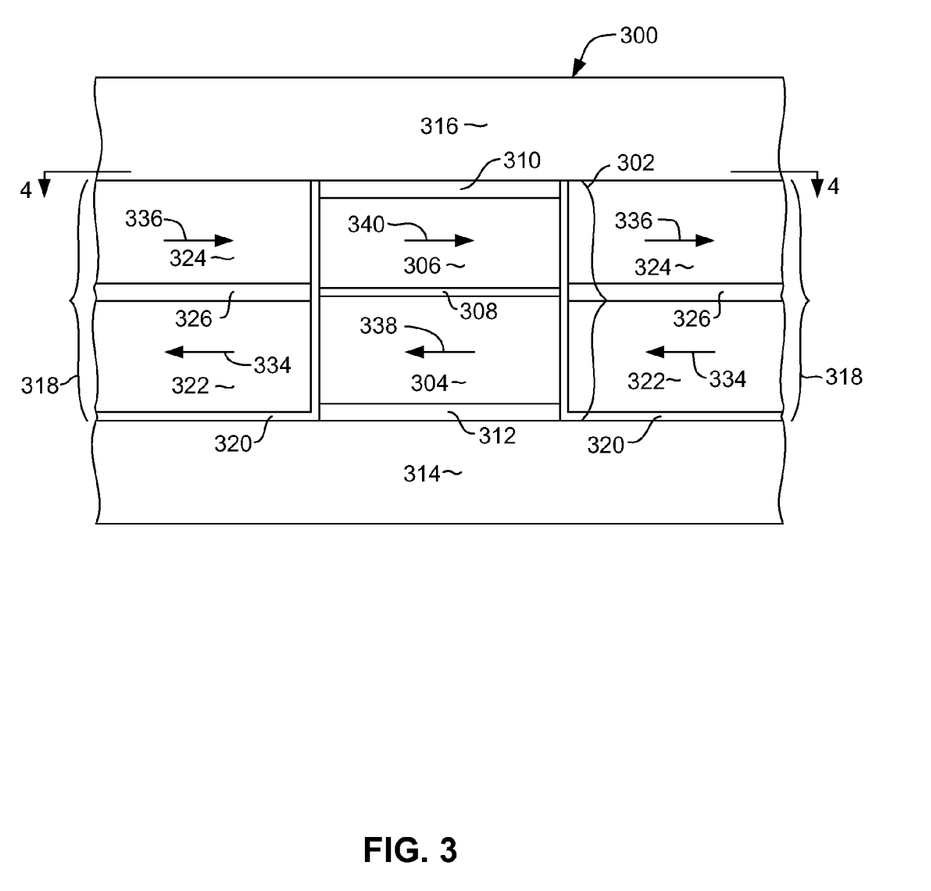
FIG. 3 is an enlarged view of a magnetic sensor as seen from the medium facing surface.

FIG. 3, shows a view of a magnetic read head 300 as viewed from the air media facing surface. The read head 300 is a scissor type magnetoresistive sensor having a sensor stack 302 that includes first and second magnetic free layers 304, 306 that are anti-parallel coupled across a non-magnetic layer 308 that can be a non-magnetic, electrically insulating barrier layer such as MgOx or an electrically insulating spacer layer such as AgSn. A capping layer structure 310 can be provided at the top of the sensor stack 302 to protect the layers of the sensor stack during manufacture. The sensor stack 302 can also include a seed layer structure 312 at its bottom to promote a desired grain growth in the above formed layers.

The first and second magnetic layers 304, 306 can be constructed of multiple layers of magnetic material. For example, the first magnetic layer 304 can be constructed of: a layer of Ni—Fe; a layer of Co—Hf deposited over the layer of Ni—Fe; a layer of Co—Fe—B deposited over the layer of Co—Hf; and a layer of Co—Fe—B. The second magnetic layer 306 can be constructed of: a layer of Co—Fe; a layer of Co—Fe—B; and a layer of Ni—Fe deposited over the layer of Co—Hf. The capping layer structure 310 can also be constructed as a multi-layer structure and can include first and second layers of Ru with a layer of Ta sandwiched there-between. The seed layer structure 312 can include a layer of Ta and a layer of Ru formed over the layer of Ta.

The sensor stack 302 is sandwiched between leading and trailing magnetic shields 314, 316, each of which can be constructed of a magnetic material such as Ni—Fe, or a composition having a high magnetic permeability ( ) to provide effective magnetic shielding.

During operation, a sense current or voltage is applied across the sensor stack 302 in a direction perpendicular to the plane of the layers of the sensor stack 302. The shields 314, 316 can be constructed of an electrically conductive material so that they can function as electrical leads as well as functioning as magnetic shields.

The electrical resistance across the sensor stack 302 depends upon the direction of magnetization of the magnetic free layers 304, 306 relative to one another. The closer the magnetizations of the layers 304, 306 are to being parallel to one another, the lower the electrical resistance will be, and, conversely, the closer the magnetizations of the layers 304, 306 are to being anti-parallel to one another, the higher the electrical resistance will be. Since the orientations of the magnetizations of the layers 304, 306 are free to move in response to an external magnetic field, this change in magnetization direction and resulting change in electrical resistance can be used to detect a magnetic field such as from an adjacent magnetic media (not shown in FIG. 3). The relative orientations of the magnetizations of the layers 304, 306 will be described in greater detail below with reference to FIG. 4. If the non-magnetic layer 308 is an electrically insulating barrier layer, then the sensor operates based on the spin dependent tunneling effect of electrons tunneling through the barrier layer. On the other hand, if the layer 308 is an electrically conductive spacer layer, then the change in electrical resistance results from the spin dependent scattering phenomenon.

With continued reference to FIG. 3, the sensor 300 also can include an anti-parallel soft magnetic side shield structures 318 at either side of the sensor stack 302. Each of the side shield structures 318 is separated from the sensor stack 302 and from the bottom shield 314 by a thin, non-magnetic, electrically insulating layer 320, which can be a material such as alumina, SixNy, $Ta_2O_5$, or MgO. Each of the side shield structures 318 includes first and second soft magnetic layers 322, 324 that are anti-parallel coupled with one another across an anti-parallel coupling layer 326. The soft magnetic layers 322, 324 are constructed of a material such as NiFe, NiFeCr, CoNiFe, or an alloy thereof that a low magnetic coercivity and a high magnetization saturation. The soft magnetic layers 322, 324 can be constructed of the same materials as one another or can be constructed of different materials having differing magnetic moments (Bs). A seed layer 332 can be provided at the bottom of the shield structure 318 to provide a desired grain structure in the layers 322, 324, 326 formed there-above. The soft magnetic layers 322, 324 have magnetizations 334, 336 respectively that are oriented in opposite directions, each parallel with the air bearing surface.

Figure 4:
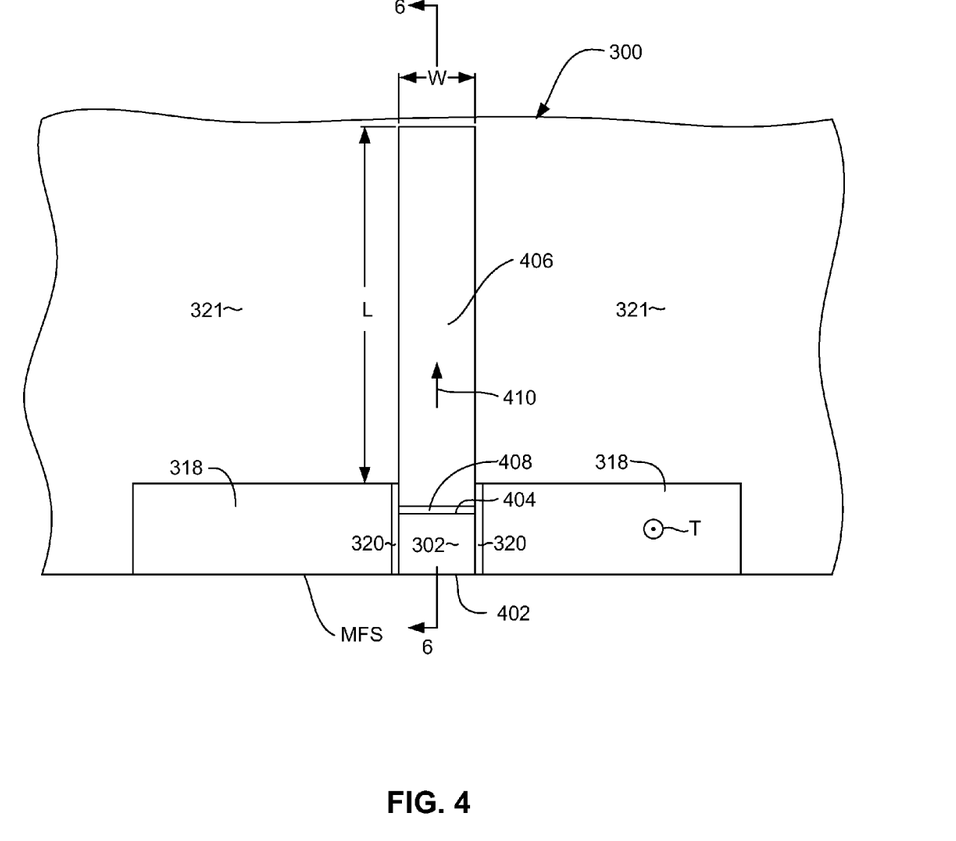
FIG. 4 is a top down cross sectional view of the magnetic sensor as seen from line 4-4 FIG. 3.

FIG. 4 shows a top down, cross sectional view as seen from line 4-4 of FIG. 3. FIG. 4 shows the sensor stack 302 having a front edge 402 that extends to the media facing surface (MFS) and has a back edge 404 opposite the front edge 402. The distance between the front edge 402 and back edge 404 defines the stripe height of the sensor stack 302.

As can be seen in FIG. 4, the sensor 300 also includes a magnetic bias structure 406 that extends from the back edge 404 of the sensor stack 302 in a direction away from the media facing surface (MFS). The space behind the side shields 318 and at either side of the bias structure 406 can be filled with a non-magnetic, electrically insulating fill material such as alumina ($Al_2O_3$) 321. The magnetic bias structure 406 is constructed of a material having a high magnetic moment. The magnetic bias structure 406 is preferably constructed of a material having a magnetic moment of at least 1.0 T, and more preferably 1.6 T or greater. Previously it had been believed that a bias structure had to be constructed of a hard magnetic material having a high magnetic coercivity. Such materials, once magnetized, maintain their magnetization as a result of their high magnetic coercivity. It has been believed that in order to prevent the bias structure from becoming de-magnetized and losing its ability to provide a magnetic bias field, a magnetic bias structure had to be constructed of such a high magnetic moment material. Such high coercivity materials necessarily have a relatively low magnetic moment such as 0.5 T or lower.

However, the inventors have found that with proper design of the bias layer 406, the bias structure 406 can be constructed of a material having a high magnetic moment even if such material has a lower magnetic coercivity (e.g. is magnetically soft). What's more, the inventors have found that the use of such a magnetic bias structure 406 results in a decrease in signal asymmetry, and also, surprisingly, maintains high signal amplitude.

To this end, the magnetic bias structure 406 can be constructed of a magnetic material having a high magnetic moment of at least 1.0 T. Suitable materials for the magnetic bias structure include NiFe having a high Fe content, such as greater than 40 atomic percent. More specifically the bias structure could be constructed of Ni—Fe having an Fe content of 50-60 atomic percent. This material has a magnetic moment of about 1.6 T. The magnetic bias structure 406 can also be constructed of CoFe, which has a magnetic moment of about 2.4 T.

As discussed above, the bias layer can maintain its magnetization 410 (FIG. 4) even when made of a low coercivity, high magnetic moment material if certain design considerations are met. For example, with reference to FIG. 4 (which is not to scale), the bias structure 406 can be constructed with a length L measured perpendicular to the media facing surface MFS, and has a width W measured parallel with the media facing surface MFS. If the width W is small relative to the length L, the magnetic bias structure has a shape enhanced magnetic anisotropy that keeps the magnetization 410 aligned in the desired direction even though the bias layer structure 406 has a low magnetic coercivity.

Figure 6:
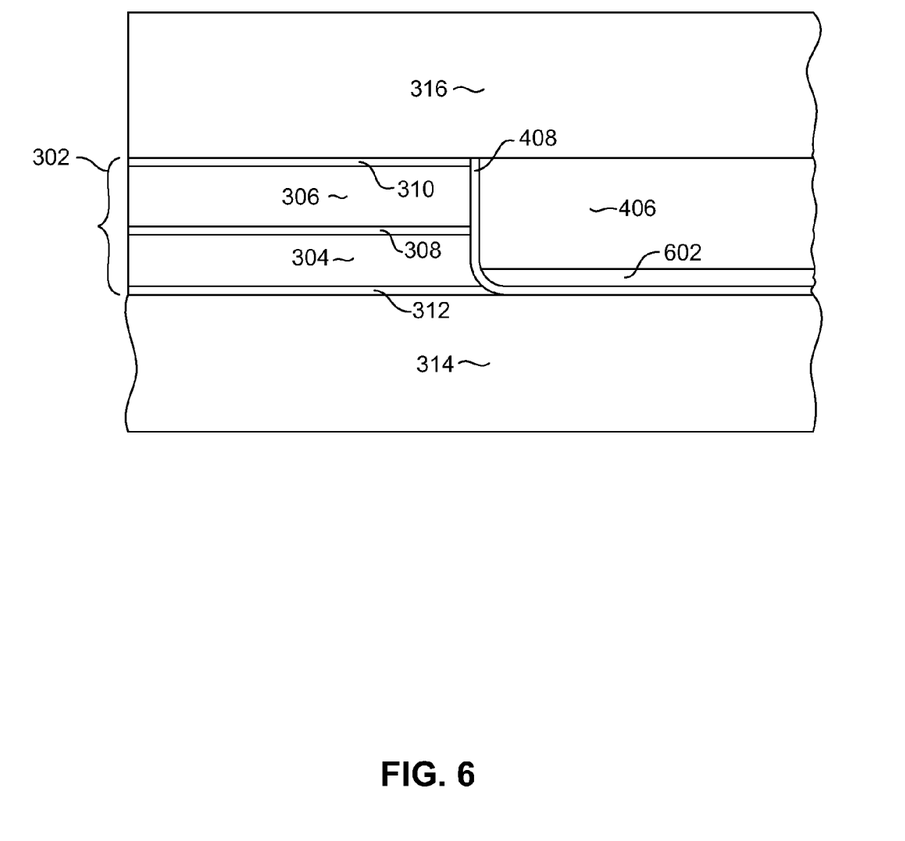
FIG. 6 is a side, cross sectional view as seen from line 6-6 of FIG. 4.
Figure 8:
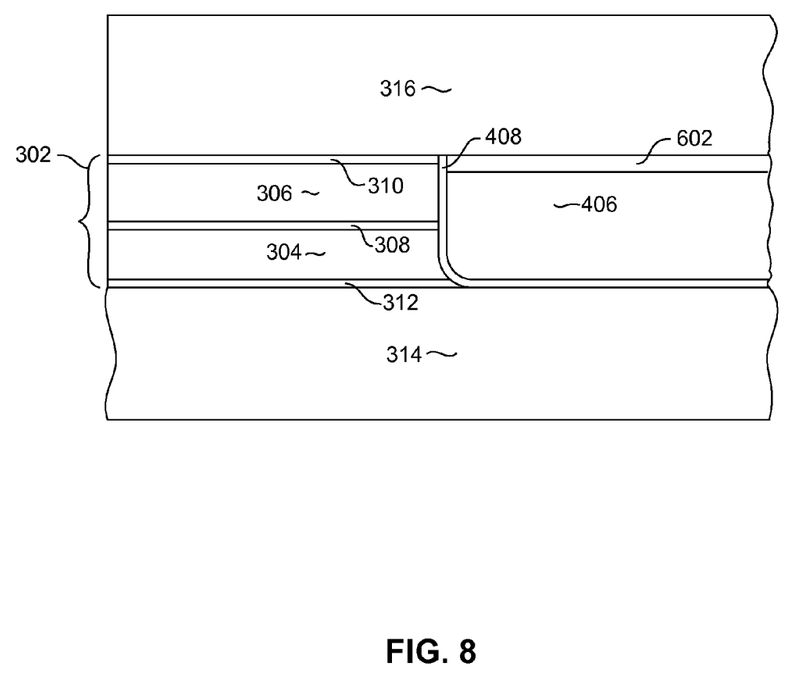
FIG. 8 is a side, cross sectional view according to an alternate embodiment.

In addition, the magnetization 410 of the bias structure 406 can be maintained by exchange coupling with a layer of anti-ferromagnetic material. With reference now to FIG. 6, which shows a side cross sectional view as seen from line 6-6 of FIG. 4, a layer of anti-ferromagnetic material (AFM layer) such as IrMn or PtMn 602 can be exchange coupled with the magnetic bias structure 406. The AFM layer 602 can be formed beneath the bias layer 406 as shown in FIG. 6, or could alternatively also be formed above the bias layer 406 (as shown in FIG. 8). While the AFM layer 602 does not in and of itself have a net magnetization of its own, when is exchange coupled with a layer of magnetic material such as the bias layer 406 it strongly pins the magnetization of that layer.

The magnetic bias structure is separated from the sensor stack 302 by a non-magnetic, electrically insulating layer 408, such as alumina, $Si_3N_4$, MgO, $Ta_2O_5$, or a combination thereof. The soft magnetic bias structure has a magnetization 410 that is oriented in a direction that is perpendicular to the media facing surface MFS, as shown.

Figure 5:
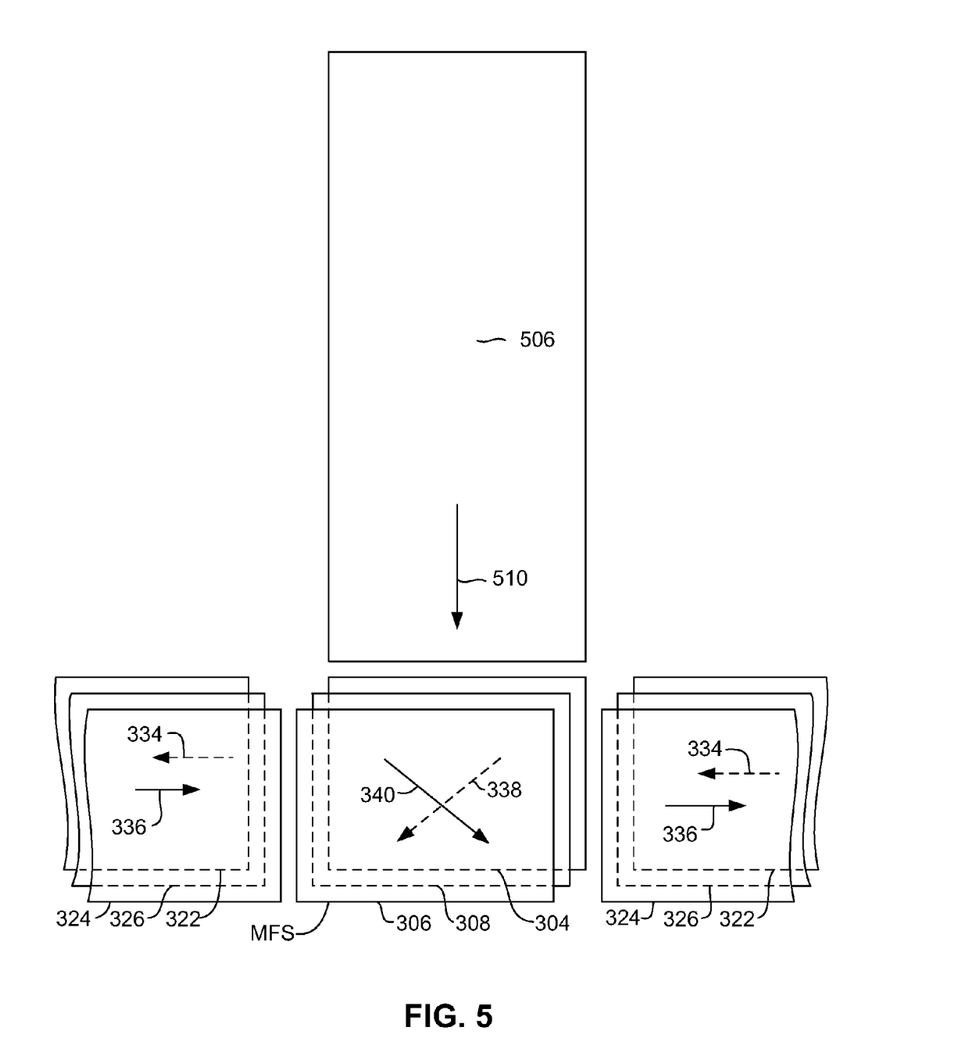
FIG. 5 is an exploded schematic view of a scissor type magnetic sensor illustrating the effect of magnetic biasing on magnetizations of magnetic free layers of a scissor type magnetic sensor.

FIG. 5 shows an exploded schematic view of the sensor 300. As shown in FIG. 5, the free layers 304, 306 have magnetizations 338, 340 that are oriented generally orthogonal to one another. In the absence of a magnetic field from the magnetization 410 of the bias layer 406, the magnetizations 338, 340 would tend to align anti-parallel to one another in a direction parallel with the media facing surface MFS, as a result of the anti-parallel coupling of the free layers 304, 306 and a magnetic anisotropy in a direction parallel with the media facing surface MFS.

However, the presence of the magnetic field from the magnetization 410 of the bias structure 406 causes the magnetizations 338, 340 to rotate so that they are generally orthogonal as shown. However, the magnetizations 338, 340 can respond to a magnetic field by rotating in a scissoring fashion. While the bias layer rotates the magnetizations 338, 340 of the free layers 304, 306 in desired orthogonal directions, the magnetization 410 of the bias layer 406 does not prevent the magnetizations 338, 340 from flipping direction (e.g. with magnetization 336 pointing to the right and 338 pointing to the left), which would render the sensor 300 incompatible with the signal processing circuitry and would, therefore, render the sensor 300 useless.

The magnetizations 334, 336 from the layers 322, 324 of the soft side shield structure 318 (FIG. 3) prevent this. As can be seen in FIG. 3, the magnetic layer 322 is aligned with the bottom free layer 304 and the upper magnetic layer 324 is aligned with the upper free layer 306. Therefore, the magnetization 334 tends to pull the magnetization 338 in one direction parallel with the media facing surface MFS, whereas the magnetization 336 tends to pull the magnetization 340 in an opposite direction parallel with the media facing surface MFS. This effectively prevents the magnetizations 338, 340 from flipping direction and improves the reliability of the sensor.

Figure 7:
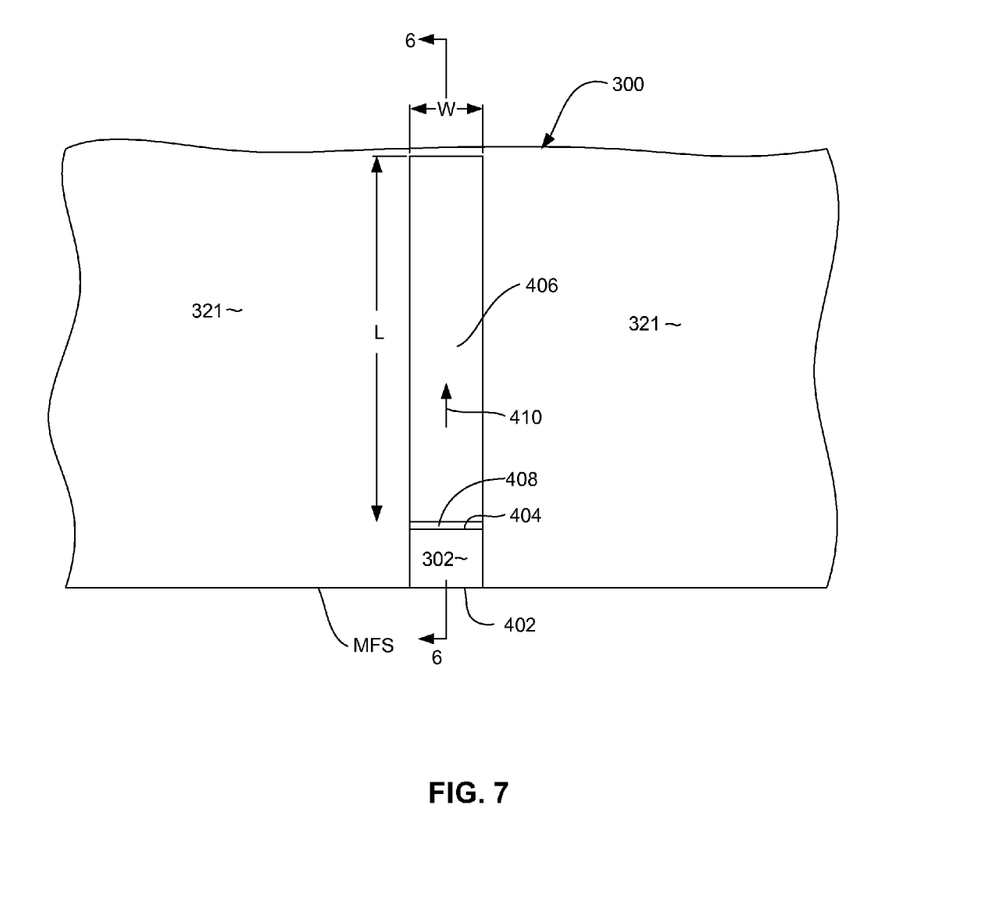
FIG. 7 is top down cross sectional view similar to that of FIG. 4 of a sensor according to an alternate embodiment.

With reference to FIG. 7, an alternate embodiment is described. This embodiment includes a sensor 700 that can be similar to that described above with reference to FIGS. 3, 4 and 6, except that the side shield structures 318, described above with reference to FIGS. 3, 4 and 6, have been omitted. In this structure the magnetic biasing from the bias structure 406 maintains proper orientation of the magnetic layers of the sensor structure 302 without such side shields. As can be seen, in the embodiment shown in FIG. 7 the non-magnetic, electrically insulating fill layer 321 can extend to the media facing surface (MFS) adjacent to the sides of the sensor stack 302. Also, since the material 321 is non-magnetic, and electrically insulating, the insulation layers 320 described above with reference to FIG. 3 are unnecessary.

While various embodiments have been described above, it should be understood that they have been presented by way of example only and not limitation. Other embodiments falling within the scope of the invention may also become apparent to those skilled in the art. For example, while use of a magnetic sensor was described in terms of a magnetic disk drive system, such sensor could also be used in other applications such as in a magnetic tape drive system or other application. Thus, the breadth and scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic sensor, comprising:
   first and second free magnetic layers that are anti-parallel coupled with one another by a non-magnetic anti-parallel coupling layer sandwiched between the first and second free magnetic layers, the first and second free magnetic layers each having a front edge located at a media facing surface and a back edge opposite the front edge; and
   a magnetic bias layer located adjacent to the back edge of the first and second free magnetic layers and extending in a direction away from the media facing surface, the magnetic bias layer comprising a material having a high magnetic moment;
   wherein the magnetic bias layer is formed entirely of NiFe having an Fe content greater than 40 atomic percent, but not greater than 60 atomic percent; and
   wherein the first and second free magnetic layers and the non-magnetic anti-parallel coupling layer have first and second laterally opposed sides, the magnetic sensor further comprising first and second soft magnetic side shield structures extending from each of the first and second sides of the first and second magnetic free layers and non-magnetic anti-parallel coupling layer.

2. The magnetic sensor as in claim 1, wherein the magnetic bias layer has a magnetic moment of at least one Tesla.

3. The magnetic sensor as in claim 1, wherein the magnetic bias layer comprises NiFe having an Fe content of 50-60 atomic percent.

4. The magnetic sensor as in claim 1, wherein the magnetic bias layer has a magnetic moment of at least 1.6 Tesla.

5. The magnetic sensor as in claim 1, further comprising, a non-magnetic, electrically insulting layer separating the magnetic bias layer from the first and second free magnetic layers and the non-magnetic anti-parallel coupling layer.

6. The magnetic sensor as in claim 1, wherein the first and second soft magnetic side shield structures each include first and second anti-parallel coupled soft magnetic layers.

7. The magnetic sensor as in claim 6, wherein the soft magnetic side shield structures are separated from the first and second magnetic free layers and anti-parallel coupling layer by a non-magnetic, electrically insulating layer.

8. The magnetic sensor as in claim 1, wherein the magnetic sensor is a scissor type magnetic sensor.

9. The magnetic sensor as in claim 1, further comprising a layer of anti-ferromagnetic material exchange coupled with the magnetic bias layer.

10. The magnetic sensor as in claim 1, wherein the layer of anti-ferromagnetic material is exchange coupled with a bottom surface of the magnetic bias layer.

11. The magnetic sensor as in claim 1, wherein the layer of anti-ferromagnetic material is exchange coupled with an upper surface of the magnetic bias layer.

12. The magnetic sensor as in claim 1, wherein the magnetic bias layer has a length measured perpendicular to the back edge of the first and second magnetic free layers, the magnetic bias layer has a width measured parallel with the back edge of the first and second magnetic free layers and wherein the length is larger than the width so as to create a shape enhanced magnetic anisotropy in the magnetic bias layer that is oriented perpendicular to the back edge of the first and second magnetic free layers.

13. A magnetic data recording system, comprising:
   a magnetic head;
   a mechanism for moving a magnetic media relative to the magnetic head; and
   a magnetic sensor formed on the magnetic head, the magnetic sensor further comprising:
   first and second free magnetic layers that are anti-parallel coupled with one another by a non-magnetic anti-parallel coupling layer sandwiched between the first and second free magnetic layers, the first and second free magnetic layers each having a front edge located at a media facing surface and a back edge opposite the front edge; and
   a magnetic bias layer located adjacent to the back edge of the first and second free magnetic layers and extending in a direction away from the media facing surface, the magnetic bias layer comprising a material having a high magnetic moment;
   wherein the magnetic bias layer is formed entirely of NiFe having an Fe content greater than 40 atomic percent, but not greater than 60 atomic percent; and
   wherein the first and second free magnetic layers and the non-magnetic anti-parallel coupling layer have first and second laterally opposed sides, the magnetic sensor further comprising first and second soft magnetic side shield structures extending from each of the first and second sides of the first and second magnetic free layers and non-magnetic anti-parallel coupling layer.

14. The magnetic sensor as in claim 13, wherein the magnetic bias layer has a magnetic moment of at least one Tesla.

15. The magnetic sensor as in claim 13, wherein the magnetic bias layer comprises NiFe having an Fe content of 50-60 atomic percent.

16. The magnetic sensor as in claim 13, wherein the magnetic bias layer has a magnetic moment of at least 1.6 Tesla.

* * * * *